United States Patent
Liang

(10) Patent No.: US 9,570,351 B2
(45) Date of Patent: Feb. 14, 2017

(54) REUSABLE SEMICONDUCTOR SUBSTRATES

(71) Applicant: Hewlett-Packard Development Company, L.P., Houston, TX (US)

(72) Inventor: Di Liang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/795,684

(22) Filed: Jul. 9, 2015

(65) Prior Publication Data
US 2017/0011964 A1    Jan. 12, 2017

(51) Int. Cl.
| | | |
|---|---|---|
| H01L 29/32 | (2006.01) | |
| H01L 21/78 | (2006.01) | |
| H01L 21/02 | (2006.01) | |
| H01L 21/3105 | (2006.01) | |
| H01L 23/00 | (2006.01) | |

(52) U.S. Cl.
CPC ......... *H01L 21/78* (2013.01); *H01L 21/02521* (2013.01); *H01L 21/02609* (2013.01); *H01L 21/3105* (2013.01); *H01L 23/564* (2013.01); *H01L 29/32* (2013.01)

(58) Field of Classification Search
CPC .............................. H01L 29/32; H01L 23/564
See application file for complete search history.

(56) References Cited

U.S. PATENT DOCUMENTS

| | | | | |
|---|---|---|---|---|
| 5,882,987 A | * | 3/1999 | Srikrishnan | H01L 21/76251 148/DIG. 50 |
| 6,103,599 A | | 8/2000 | Henley et al. | |
| 8,367,521 B2 | | 2/2013 | Daval et al. | |
| 2004/0000268 A1 | * | 1/2004 | Wu | H01L 21/02381 117/94 |
| 2008/0211061 A1 | | 9/2008 | Atwater, Jr. et al. | |

FOREIGN PATENT DOCUMENTS

WO    WO-2014084682 A1    6/2014

OTHER PUBLICATIONS

Czornomaz, L. "An Integration Path for Gate-first UTB III-V-on-insulator MOSFETs with Silicon, using Direct Wafer Bonding and Donor Wafer Recycling" Elec. Dev. Meet. (IEDM) 2012 IEEE Int. appears to have been released at the conference itself on Dec. 2012 pp. 23.4.1-23.4.4.*

(Continued)

*Primary Examiner* — Matthew Landau
*Assistant Examiner* — Grant Withers
(74) *Attorney, Agent, or Firm* — Tong, Rea, Bentley & Kim, LLC

(57) ABSTRACT

In example implementations, a plurality of material layers and a plurality of etch stop layers are grown on a first substrate. Ions are implanted through at least one material layer of the plurality of material layers into an etch stop layer of the plurality of etch stop layers to create defects in the etch stop layer. A first material layer of the substrate is bonded to a second substrate. The etch stop layer is split to remove the first substrate from the second substrate. The first substrate is reused to bond another material layer of the plurality of material layers to a third substrate.

10 Claims, 4 Drawing Sheets

(56) References Cited

OTHER PUBLICATIONS

Weiner et al. ("Weiner" Weiner, J. S. "Nonlinear spectroscopy of InGaAs/InAlAs multiple quantum well structures" Appl. Phys. Lett. 49, 531 Sep. 1986 pp. 531-533).*
Chen, P. "High crystalline-quality III-V layer transfer onto Si substrate" Appl. Phys. Lett. 92 Mar. 2008 pp. 1-3.*
Celler, G. K. et al., "Frontiers of Silicon-On-Insulator," Journal of Applied Physics 93.9, 2003, pp. 4955-4978, available at http://soitec.com/pdf/Frontiers_SOI.pdf.

\* cited by examiner

REUSABLE SEMICONDUCTOR SUBSTRATES

BACKGROUND

Hybrid or heterogeneous integration by wafer bonding is a powerful method to integrate two incompatible materials together. A typical process to fabricate a hybrid platform requires growing an etch stop layer between a first semiconductor substrate and an epitaxial layer. The epitaxial layer is bonded to a second semiconductor substrate and the first semiconductor substrate is sacrificed to transfer a thin layer of the first semiconductor substrate onto the second semiconductor substrate. Some methods for fabricating a hybrid platform also require an additional polishing step to provide a smooth mirror-like surface, which is a slow, inefficient and expensive process.

DETAILED DESCRIPTION

The present disclosure discloses a reusable substrate and a method for hybrid wafer bonding using the reusable substrate. As discussed above, hybrid or heterogeneous integration by wafer bonding is a powerful method to integrate two incompatible materials together. However, normally one material will be the substrate and the other one is thinned down to micron meter or nanometer scale to become a thin layer on the new substrate. The process of thinning one material leads to a waste of the thinned materials, and increases cost related to fabricating and removing the substrate. This potentially results in thickness non-uniformity and surface roughness in this thin layer if a grinding method is used for material thinning.

For example, one process to fabricate a hybrid platform may require growing an etch stop layer between a first semiconductor substrate and an epitaxial layer. The epitaxial layer is bonded to a second semiconductor substrate and the first semiconductor substrate is sacrificed to transfer a thin layer of the first semiconductor substrate onto the second semiconductor substrate.

Some example methods to resolve the issue of wasted semiconductor include a "smart-cut" method. However, smart-cut methods require an additional polishing step to provide a smooth mirror-like surface, which can be a slow, inefficient and expensive process. In addition, the smart-cut method may lead to inevitable thickness non-uniformity, typically 5-10% of the thinned layer.

Examples of the present disclosure provide a reusable substrate that can be bonded to another substrate and reused. After the reusable substrate is removed, the reusable substrate may be bonded to another substrate repeatedly until all semiconductor layers of the reusable substrate are used. In one example, an etch stop layer is grown between each semiconductor layer. The etch stop layer may be etched away (e.g., using a wet etch process) to leave a smooth mirror like surface without requiring a polishing step (e.g., a chemical mechanical polish (CMP)).

Figure 1:
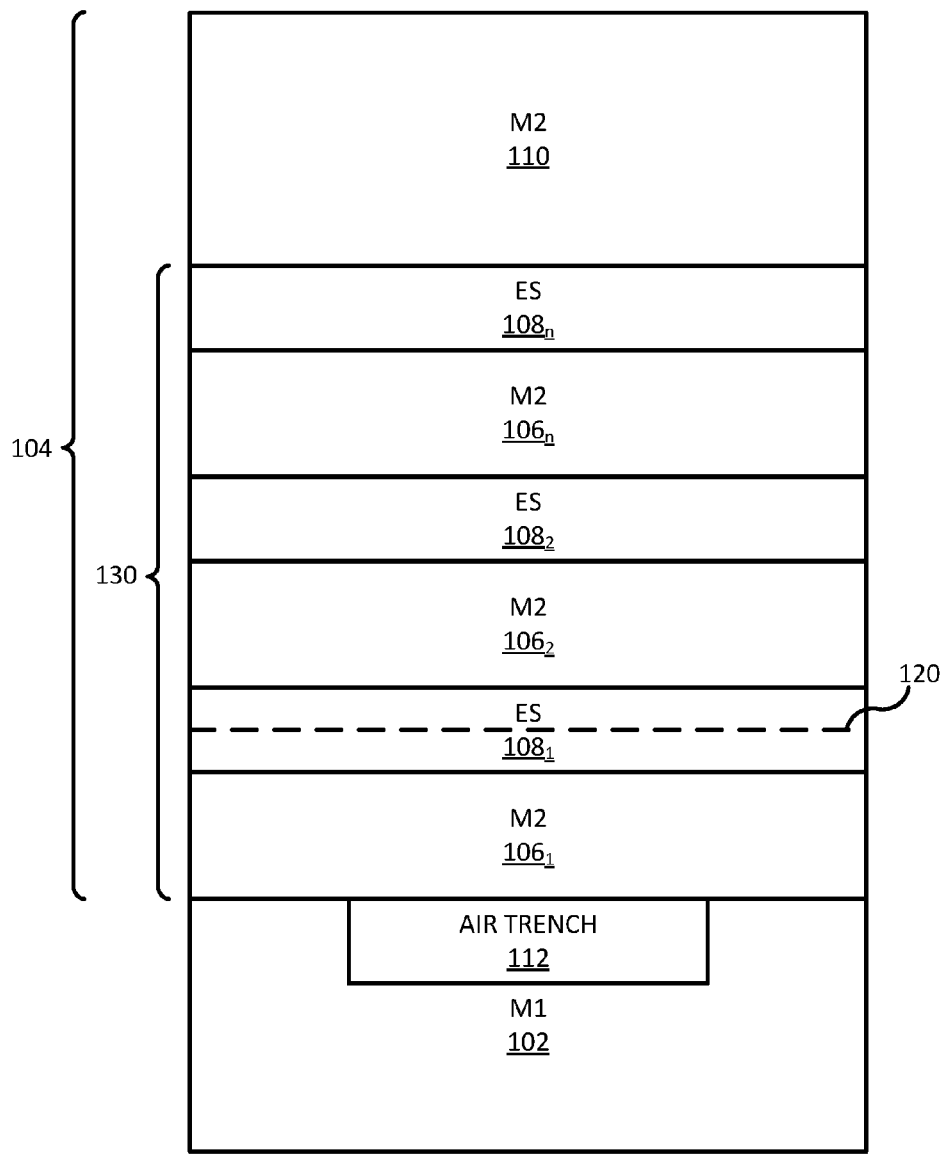
FIG. 1 is a block diagram of an example substrate of the present disclosure.

FIG. 1 illustrates an example substrate 100 of the present disclosure. The substrate 100 includes a first substrate or first semiconductor substrate 102 and a second substrate or a second semiconductor substrate 104. It should be noted that the terms "first" and "second" are used herein as labels to differentiate or identify the different substrates and not to convey any order or sequence. For example, the terms "first" and "second" may be used to refer to either substrate 102 or substrate 104 depending on how the substrate 102 and the substrate 104 is discussed below.

In one example, the first substrate 102 may include a shallow air trench 112. In one example, the air trench 112 may have any depth that is below a top surface of the first substrate 102.

In one example, the first substrate 102 may be an elementary semiconductor or compound semiconductor. For example, the elementary semiconductor may include silicon (Si), germanium (Ge) or carbon (C). For example, the compound semiconductor may be any III-V compound semiconductor (e.g., indium phosphide (InP), gallium arsenide (GaAs), aluminum gallium arsenide (AlGaAs), indium gallium arsenide phosphide (InGaAsP), and the like) or any II-VI compound semiconductor (e.g., cadmium telluride (CdTe), zinc oxide (ZnO), and the like). In one example, the first substrate 102 may be a silicon (Si) wafer that is being combined with another semiconductor or dielectric, e.g., silicon dioxide ($SiO_2$).

In one example, the second substrate 104 may include a base layer 110 and a stack 130. In one example, the stack 130 may include a plurality of material layers $106_1$ to $106_n$ (herein referred to individually as material layer 106 or collectively material layers 106) and a plurality of etch stop layers $108_1$ to $108_n$ (herein referred to individually as etch stop layer 108 or collectively as etch stop layers 108) grown in an alternating fashion. Said another way, the second substrate 104 has an etch stop layer 108 between each of the plurality of material layers 106. In one example, the material of the material layers 106 may be a semiconductor and may also be referred to herein individually as a semiconductor layer 106 or collectively as semiconductor layers 106.

In one example, at least one of the semiconductor layers 106 may include a plurality of thin layers to form a multiple quantum well structure. For example, a single semiconductor "layer" may actually be composed of multiple different layers. For example, a layer of gallium arsenide (GaAs) may be sandwiched between two layers of a material with a wider band gap like aluminum arsenide (AlAs). However, the layers of the GaAs and the AlAs may be between two etch stop layers 108 and be considered a single "layer" of the stack 130.

In one example, the second substrate 104 may be an elementary semiconductor or compound semiconductor. For example, the elementary semiconductor may include silicon (Si), germanium (Ge) or carbon (C). For example, the compound semiconductor may be any III-V compound semiconductor (e.g., indium phosphide (InP), gallium arsenide (GaAs), aluminum gallium arsenide (AlGaAs), indium gallium arsenide phosphide (InGaAsP), and the like) or any II-VI compound semiconductor (e.g., cadmium telluride (CdTe), zinc oxide (ZnO), and the like).

In one example, each one of the etch stop layers 108 may be a compound different than the semiconductor layers 106. As a result, during an etching step, discussed below, the etch stop layer will be selectively etched over the semiconductor layers 106. Examples of the semiconductor layers and the etch stop layers may include indium phosphide (InP) semiconductor layers with indium gallium arsenide (InGaAs) etch stop layers, gallium arsenide (GaAs) semiconductor layers with aluminum gallium arsenide (AlGaAs) etch stop layers, gallium nitride (GaN) semiconductor layers with indium gallium nitride (InGaN) etch stop layers, and the like.

In one example, two or more of the semiconductor layers 106 and two or more of the etch stop layers 108 may be different. For example, the semiconductor layer $106_1$ and the etch stop layer $108_1$ may be InP and InGaAs, respectively, and the semiconductor layer $106_2$ and the etch stop layer $108_2$ may be GaAs and AlGaAs, respectively. In other words, the semiconductor layers 106 may all be the same and the etch stop layers 108 may all be the same. Alternatively, the semiconductor layers 106 may be different and the etch stop layers 108 may be different.

In one example, the semiconductor layers 106 and the etch stop layers 108 of the second substrate 104 may be grown. Processes that can be used to grow the semiconductor layers 106 and the etch stop layers 108 may include a molecular beam epitaxy (MBE), a metalorganic vapor phase epitaxy (MOCVD), and the like. The semiconductor layers 106 may be grown to be any desired thickness. Each one of the semiconductor layers 106 may have a same thickness or a different thickness. The etch stop layers 108 may also be grown to be any desired thickness. In one example, the thickness of the etch stop layers 108 may be a function of the wet etch process (discussed below) used to remove the etch stop layers 108.

In one example, an ion implantation process (e.g., hydrogen ions ($H^+$)) may be used to create defects in an etch stop layer of the plurality of etch stop layers 108. For example, some applications may use more than one semiconductor layer 106. As a result, the ion implantation process may be used to create a defect in any etch stop layer $108_1$, $108_2$ to $108_n$ depending on the desired number of semiconductor layers 106 used for a particular application.

In one example, the ion implantation process may be used to create defects in a top most etch stop layer (e.g., etch stop layer $108_1$) of the second substrate 104. The defects are illustrated by a dashed line 120. Said another way, the etch stop layer 108 closest to the first substrate 102 comprises the defects caused by the ion implantation process. Said yet another way, the first semiconductor layer $106_1$ and the adjacent first etch stop layer $108_1$ that are positioned at a part of the stack 130 farthest from the first substrate 102 are implanted with the ions.

In one example, the second substrate 104 may be removed by splitting the etch stop layer 108 having the defects shown by the dashed line 120. As a result, the stack 130 including any semiconductor layers between the etch stop layer that is split and the first substrate 102 and the second substrate 104 may be removed. For example, if the defects are created in the first etch stop layer $108_1$, then the semiconductor layer $106_1$ remains bonded to the first substrate 102 and the remaining semiconductor layers $106_2$ to $106_n$ of the second substrate 104 may be reused for bonding to another substrate. In another example, if the defects are created in the second etch stop layer $108_2$, then the semiconductor layers $106_1$ and $106_2$ remain bonded to the first substrate 102 and the remaining semiconductor layers $106_n$ of the second substrate 104 may be reused for bonding to another substrate, and so forth.

In one example, after the second substrate 104 is split off from the first substrate 102, a wet etch process may be used to remove the portion of the etch stop layer 108 that remains on the semiconductor layers 106 (e.g., if etch stop layer $108_1$ is split, the portion of the etch stop layer $108_1$ on the semiconductor layer $106_2$ and the semiconductor layer $106_1$ may be removed). Any appropriate dry etch or wet etch process may be used. Examples of wet etch processes may include, for example, a hydrogen peroxide ($H_2O_2$)/hydrofluoric (HF) wet etch, a nitric acid ($HNO_3$) wet etch, a sulfuric acid ($H_2SO_4$) wet etch, a hydrochloric (HCl) wet etch, and the like.

Notably, the process does not require any chemical mechanical polish (CMP) steps to provide a smooth mirror like surface on the semiconductor layer $106_1$ after it is bonded to the first substrate 102. The semiconductor layers 106 are grown with a desired smoothness and after bonding, the wet etch process may be used to remove the etch stop layer $108_1$ leaving a smooth mirror like surface.

In addition, a minimal amount of semiconductor in the second substrate 104 is wasted. Moreover the second substrate 104 may be immediately used for bonding to another substrate without the need to grow or create another second substrate 104 for creating a hybrid wafer. For example, the ion implantation process may be repeated to create a defect layer in the second etch stop layer $108_2$, the anneal process may be repeated to repair damage to the second semiconductor layer $106_2$ caused by the ion implantation and the second semiconductor layer $106_2$ may be bonded to another substrate. The second substrate 104 may be reused until all of the semiconductor layers are bonded to other substrates.

Figure 2:
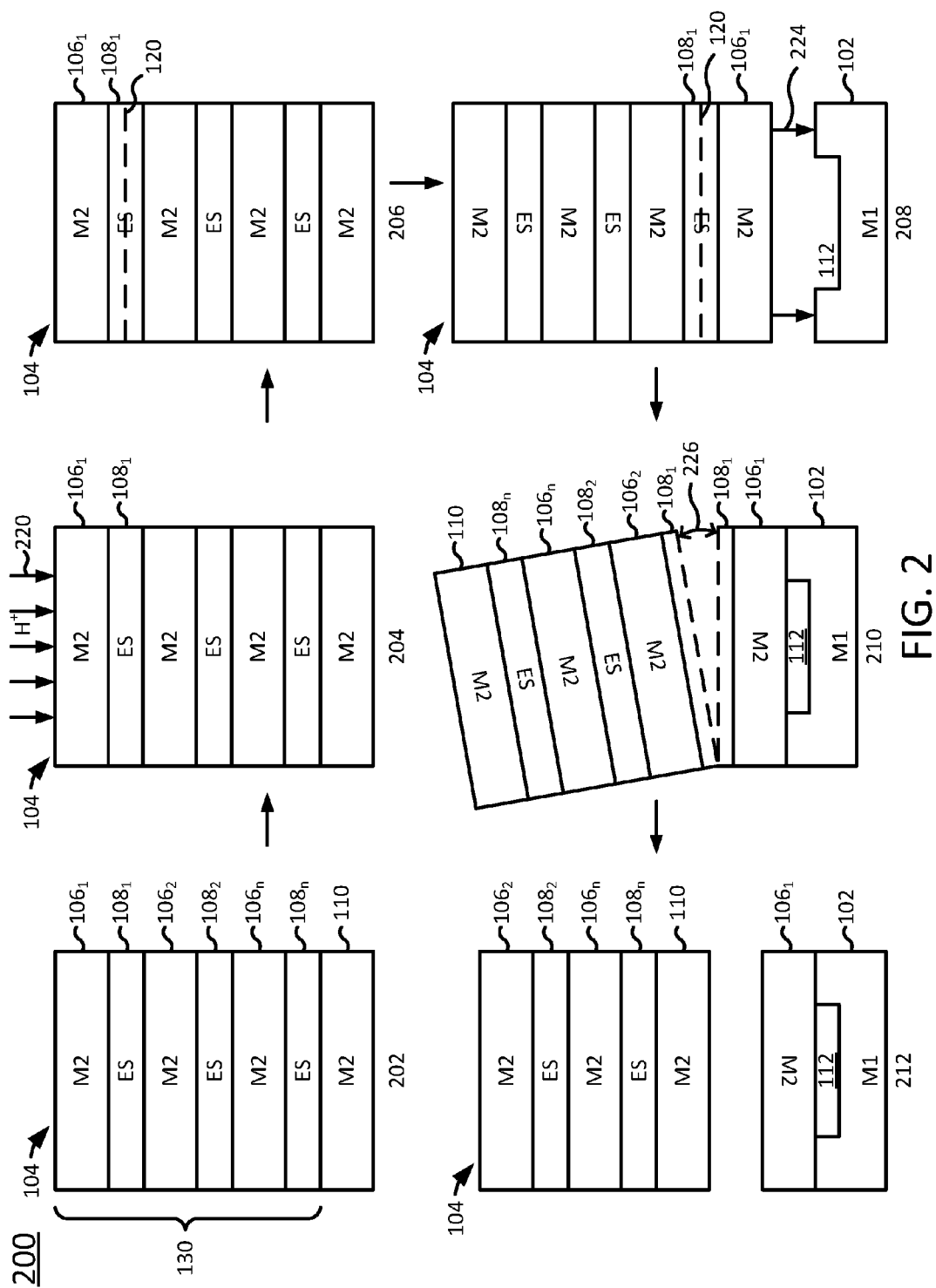
FIG. 2 is an example schematic process flow of the present disclosure.

FIG. 2 illustrates an example schematic process flow 200 of the present disclosure. The schematic of the process flow 200 illustrates an example of a single material layer 106 being removed by creating a defect in the first etch stop layer $108_1$. However, it should be noted that the defects may be created in any etch stop layer 108 to remove any number of material layers 106, as described above.

At block 202, a first substrate 104 is grown. As discussed above, the substrate 104 is grown to include a base layer 110 and a stack 130. The stack 130 may include a plurality of semiconductor layers 106 and a plurality of etch stop layers 108 that are grown in an alternating fashion. In one example, the etch stop layers 108 may be located between each of the semiconductor layers 106.

At block 204, an ion implantation process is applied to the first substrate 104. In one example, a hydrogen ion implantation process may be used. The ion implantation process bombards the top most layer of the first substrate 104 with ions through the first semiconductor layer $106_1$ into the first etch stop layer $108_1$. The ion implantation process may be controlled to create defects in the first etch stop layer $108_1$.

At block 206, a thermal anneal process may be applied to the first substrate 104. The thermal anneal process may be used to repair damage caused to the first semiconductor layer $106_1$ from the ions passing through the first semiconductor layer $106_1$ during the ion implantation process. In addition, the defect layer 120 is created in the first etch stop layer $108_1$ after the ion implantation process and the thermal anneal process.

At block 208, the first substrate 104 is then bonded to a second substrate 102 as illustrated by lines 224. In one example, the first substrate 104 is "flipped" such that the top most semiconductor layer $106_1$ is bonded to the second substrate 102. As noted above, in one example the second substrate 102 may include a shallow air trench 112.

At block 210, the defect layer 120 in the first etch stop layer $108_1$ is split to separate the first substrate 104 from the second substrate 102. As a result, the first semiconductor layer $106_1$ remains bonded to the second substrate 102 to create a hybrid wafer. In addition, the remaining semiconductor layers $106_2$ to $106_n$ remain as part of the first substrate 104. A portion of the first etch stop layer $108_1$ remains on the first semiconductor layer $106_1$ and the second semiconductor layer $106_2$. In one example, air or water is forced through the defect layer 120 to split the first substrate 104 from the second substrate 102.

At block 212, a wet etch process may be used to remove the remaining etch stop layer $108_1$ from both the semiconductor layer $106_1$ bonded to the second substrate 102 and the semiconductor layer $106_2$ remaining on the first substrate 104. As discussed above, any appropriate dry etch or wet etch process may be used. Examples of various wet etch processes may include, for example, a hydrogen peroxide ($H_2O_2$)/hydrofluoric (HF) wet etch, a nitric acid ($HNO_3$) wet etch, a sulfuric acid ($H_2SO_4$) wet etch, a hydrochloric acid (HCl) wet etch, and the like.

After the remaining etch stop layer $108_1$ is removed, a smooth mirror like surface is provided on the semiconductor layer $106_1$. In addition, a smooth mirror like surface is provided on the semiconductor layer $106_2$ for bonding to another substrate. Notably, the process 200 does not require a CMP process, which is costly, slow and that can introduce non-uniformity and surface roughness, as described above. Furthermore, the first substrate 104 may be ready for reuse and a minimal amount of semiconductor on the first substrate 104 is sacrificed during the process 200.

Figure 3:
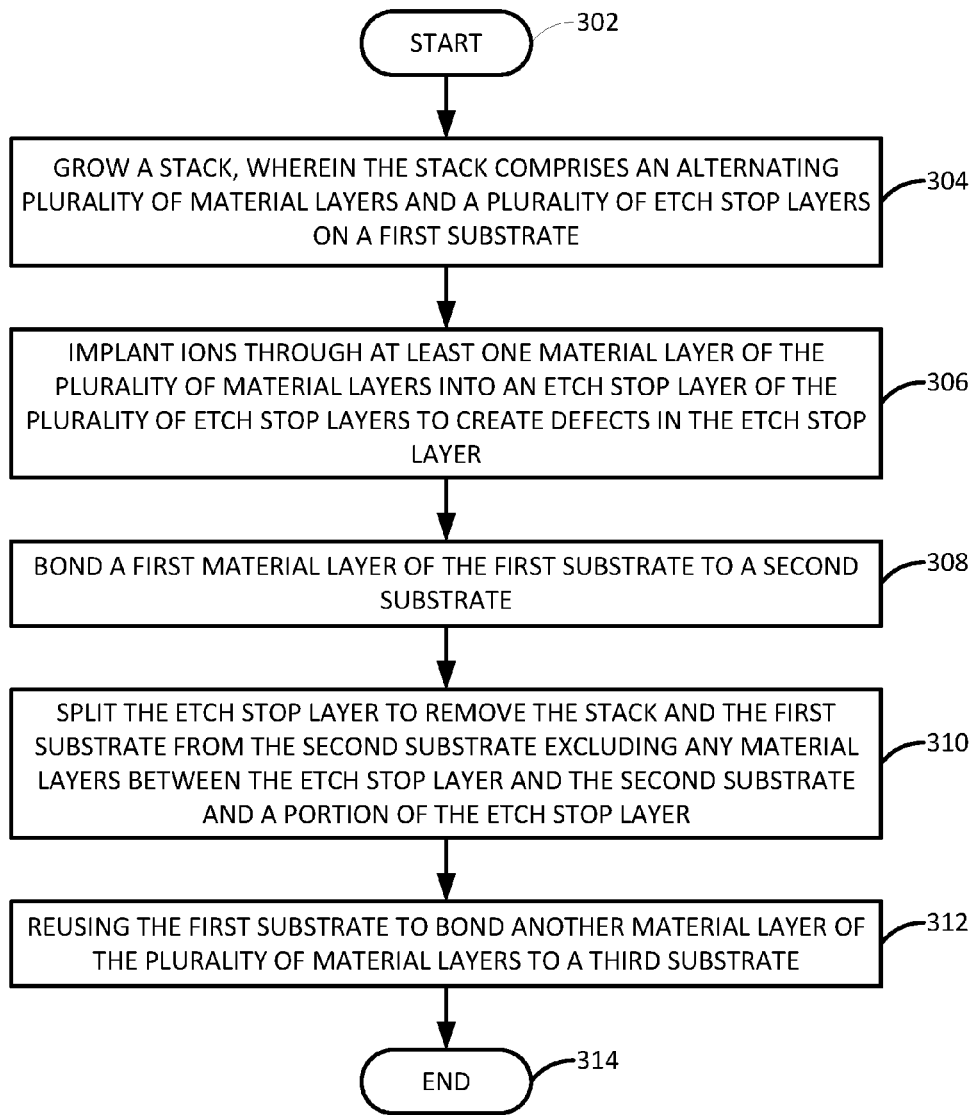
FIG. 3 is a flowchart of an example method for hybrid wafer bonding using a reusable substrate.

FIG. 3 illustrates an example flowchart of a method 300 for hybrid wafer bonding using a reusable substrate. In one example, the method 300 may be performed in a wafer fabrication plant using a plurality of different automated tools (e.g., CVD tools, wet etch tools, dry etch tools, ion implantation tools, and the like) to perform the different process described.

At block 302 the method 300 begins. At block 304, the method 300 grows a stack, wherein the stack comprises an alternating plurality of material layers and a plurality of etch stop layers in a first substrate. In one example, the material layers may be semiconductor layers. In one example, processes such as a molecular beam epitaxy (MBE), a metalorganic vapor phase epitaxy (MOCVD), and the like, can be used to grow the material layers and the etch stop layers.

At block 306, the method 300 implants ions through at least one material layer of the plurality of material layers into an etch stop layer of the plurality of etch stop layers to create defects in the etch stop layer. In one example, the defects may be created through a first material layer in a first etch stop layer. In one example, the first material layer and the first etch stop layer are adjacent and positioned at a part of the stack farthest from the first substrate.

In another example, the defect may be created in another etch stop layer other than the first etch stop layer. In one example, a hydrogen ion implantation process may be used to create the defects. In one example, a thermal anneal process may be applied to the first substrate to repair damage to the first semiconductor layer caused by the ion implantation process.

At block 308, the method 300 bonds a first material layer of the first substrate to a second substrate. Any bonding technique may be used to bond the first semiconductor layer of the first substrate to the second substrate. Example bonding techniques may include a thermo compression technique, hybridization, and the like.

In one example, the first semiconductor layer and the second substrate may comprise different semiconductor or semiconductor compounds. In other words, the first semiconductor layer may comprise a first semiconductor layer or semiconductor compound and the second substrate may comprise a second different semiconductor layer or semiconductor compound.

At block 310, the method 300 splits the first etch stop layer to remove the stack and the first substrate from the second substrate excluding any material layers between the etch stop layer and the second substrate and a portion of the etch stop layer. For example, if the defects are created in the first etch stop layer, then the first material layer and a portion of the first etch stop layer would remain on the first substrate and be excluded from the remaining stack on the second substrate. In another example, if the defects are created in the second etch stop layer, then the first and second material layers and a portion of the second etch stop layer would remain on the first substrate and be excluded from the remaining stack on the second substrate.

Air or water may be forced through the defects in the first etch stop layer to split the defects caused by the ion implantation process in block 306. The first substrate is split off of from the second substrate at the etch stop layer having the defects.

At block 312, the method 300 reuses the first substrate to bond another material layer of the plurality of material layers to a third substrate. For example, blocks 306 to 310 may be repeated to bond the second material layer to another substrate if the first material layer was removed. In one example, the blocks 306 to 312 may be repeated until all material layers of the first substrate have been used or bonded to another substrate. At block 312, the method 300 ends.

Figure 4:
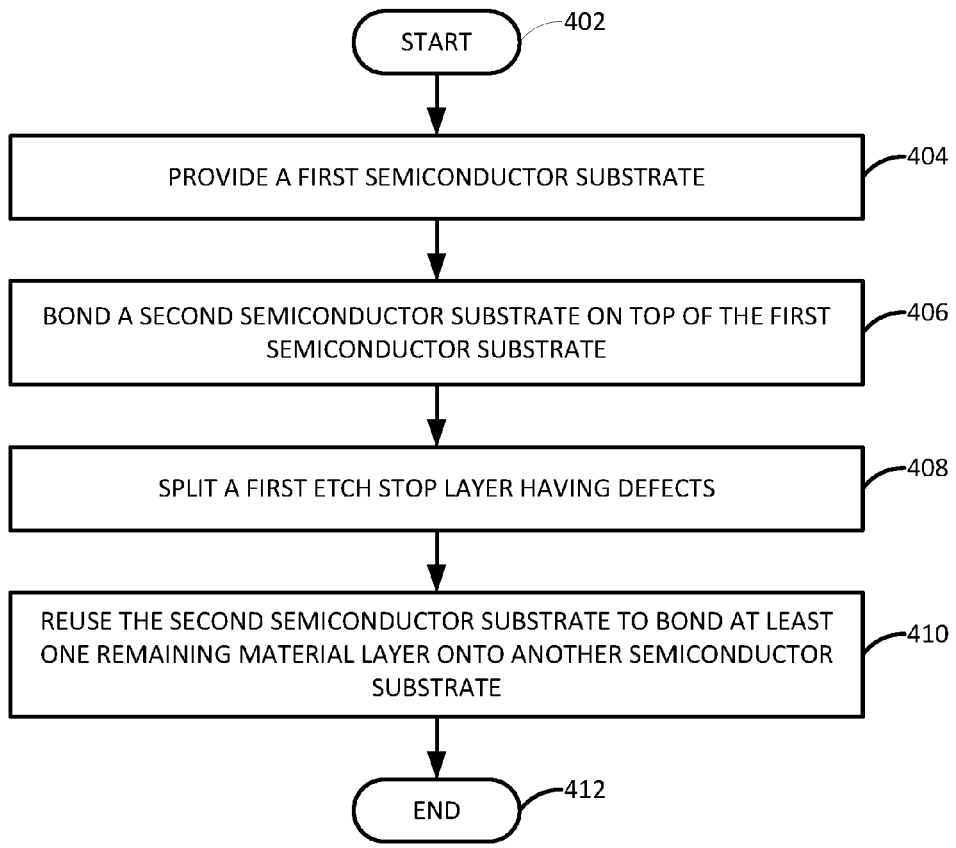
FIG. 4 is a flowchart of another example method for hybrid wafer bonding using a reusable substrate.

FIG. 4 illustrates an example flowchart of another method 400 for hybrid wafer bonding using a reusable substrate. In one example, the method 400 may be performed in a wafer fabrication plant using a plurality of different automated tools (e.g., CVD tools, wet etch tools, dry etch tools, ion implantation tools, and the like) to perform the different process described.

At block 402 the method 400 begins. At block 404, the method 400 provides a first semiconductor substrate. The first semiconductor substrate may be an elementary semiconductor or compound semiconductor. For example, the elementary semiconductor may include silicon (Si), Germanium (Ge) or Carbon (C). For example, the compound semiconductor may be any III-V compound semiconductor (e.g., indium phosphide (InP), gallium arsenide (GaAs), aluminum gallium arsenide (AlGaAs), indium gallium arsenide phosphide (InGaAsP), and the like) or any II-VI compound semiconductor (e.g., cadmium telluride (CdTe), zinc oxide (ZnO), and the like).

At block 404, the method 400 bonds a second semiconductor substrate on top of the first semiconductor substrate. In one example, the second semiconductor substrate comprises a stack of at least two material layers (e.g., semiconductor layers) and an etch stop layer between each of the at least two material layers. The material layers of the second semiconductor substrate may be the same semiconductor or semiconductor compound or different semiconductors or semiconductor compounds. In one example, the etch stop layer may have a composition or be a compound that is different than the semiconductor or semiconductor compound of an adjacent material layer. In one example, the material layer of the second semiconductor substrate may be a different semiconductor or semiconductor compound than the semiconductor or semiconductor compound of the first semiconductor substrate.

In one example, a first etch stop layer of the second semiconductor substrate may have defects. The defects may be created by an ion implantation process (e.g., a hydrogen ion implantation process). In one example, an anneal process may be applied to the second semiconductor substrate after the ion implantation process to repair any damage caused to a first semiconductor layer of the at least two semiconductor layers from the ion implantation process.

At block 408, the method 400 splits the first etch stop layer having the defects. In one example, the first etch stop layer may be split such that the first semiconductor substrate is bonded to a first material layer of the at least two material layers. In one example, air or water may be forced through the defects of the first etch stop layer to split the second semiconductor substrate away from the first semiconductor substrate.

In one example, a portion of the first etch stop layer may remain or be left on the first material layer bonded to the first semiconductor substrate. In addition, a portion of the first etch stop layer may also remain or be left on a second material layer of the at least two material layers of the second semiconductor substrate that is split off of from the first semiconductor substrate. In one example, a dry etch or a wet etch process may be used to remove the portion of the first etch stop layer remaining on the first material layer and the second material layer. After the dry etch or the wet etch process a smooth mirror like surface is created on the first material layer and the second material layer. Notably, no CMP process is required.

At block 410, the method 400 reuses the second semiconductor substrate to bond at least one remaining layer onto another semiconductor substrate. For example, when the second semiconductor substrate is split off from the first semiconductor substrate, at least one semiconductor layer and at least one etch stop layer may remain on the second semiconductor substrate. Blocks 404 to 408 of method 400 may be repeated for the at least one remaining semiconductor layer onto another semiconductor substrate. In one example, blocks 404 to 408 of method 400 may be repeated until all semiconductor layers of the second semiconductor substrate are used. At block 412, the method 400 ends.

It will be appreciated that variants of the above-disclosed and other features and functions, or alternatives thereof, may be combined into many other different systems or applications. Various presently unforeseen or unanticipated alternatives, modifications, or variations, therein may be subsequently made which are also intended to be encompassed by the following claims.

The invention claimed is:

1. A composite substrate, comprising:
a first substrate; and
a second substrate comprising a stack that is bonded to the first substrate, wherein the first substrate includes a trench on a surface that bonds to the second substrate, wherein the stack comprises a plurality of material layers having an etch stop layer between each one of the plurality of material layers, wherein an etch stop layer that is closest to the first substrate comprises defects caused by an ion implantation process, wherein the etch stop layer that is closest to the first substrate is split at the defects such that a plurality of remaining material layers of the second substrate is reusable for bonding to another substrate.

2. The composite substrate of claim 1, wherein the first substrate comprises a first semiconductor and each one of the plurality of material layers comprises a second semiconductor different from the first semiconductor.

3. The composite substrate of claim 1, wherein each one of the plurality of material layers comprises a different material.

4. The composite substrate of claim 1, wherein the ion implantation process implants hydrogen ions.

5. The composite substrate of claim 1, wherein at least one of the plurality of material layers comprises a plurality of thin layers to form a multiple quantum well structure.

6. A composite substrate, comprising:
a first substrate comprising a trench; and
a second substrate coupled to a surface of the first substrate that includes the trench, wherein the second substrate comprises at least one material layer and at least one etch stop layer, wherein an etch stop layer of the at least one etch stop layer that is closest to the first substrate comprises a first remaining portion that is split from a second remaining portion of the etch stop layer that is coupled to a second material layer along defects caused by an ion implantation process.

7. The composite substrate of claim 6, wherein the first substrate comprises a first semiconductor and the at least one material layer comprises a second semiconductor different from the first semiconductor.

8. The composite substrate of claim 6, wherein the at least one material layer comprises a plurality of material layers and each one of the plurality of material layers comprises a different material.

9. The composite substrate of claim 6, wherein the ion implantation process implants hydrogen ions.

10. The composite substrate of claim 6, wherein the at least one material layer comprises a plurality of thin layers to form a multiple quantum well structure.

* * * * *